United States Patent
Atsatt et al.

(10) Patent No.: US 9,946,826 B1
(45) Date of Patent: Apr. 17, 2018

(54) CIRCUIT DESIGN IMPLEMENTATIONS IN SECURE PARTITIONS OF AN INTEGRATED CIRCUIT

(71) Applicant: Altera Corporation, San Jose, CA (US)

(72) Inventors: Sean Atsatt, Santa Cruz, CA (US); Ting Lu, Austin, TX (US); Dana How, Palo Alto, CA (US); Herman Schmit, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 233 days.

(21) Appl. No.: 14/843,313

(22) Filed: Sep. 2, 2015

Related U.S. Application Data (60) Provisional application No. 62/045,078, filed on Sep. 3, 2014.

(51) Int. Cl.
*G06F 17/50* (2006.01)

(52) U.S. Cl.
CPC .................. *G06F 17/505* (2013.01)

(58) Field of Classification Search
CPC ..................................... G06F 17/505
USPC ........................................ 716/105
See application file for complete search history.

(56) References Cited

U.S. PATENT DOCUMENTS

| | | | | |
|---|---|---|---|---|
| 6,519,753 B1 * | 2/2003 | Ang | ..................... | G06F 17/5054 326/41 |
| 7,107,567 B1 * | 9/2006 | LeBlanc | ............. | G06F 17/5022 716/106 |
| 7,454,323 B1 * | 11/2008 | Bain | .................... | G06F 17/5022 703/13 |
| 7,768,293 B1 | 8/2010 | Knapp et al. | | |
| 7,987,358 B1 | 7/2011 | Walstrum, Jr. et al. | | |
| 8,356,358 B2 * | 1/2013 | Goldman | ................ | G06F 21/76 716/126 |
| 8,527,675 B2 * | 9/2013 | Schwartz | ................ | G06F 21/76 710/107 |
| 8,863,230 B1 | 10/2014 | Knapp et al. | | |
| 2004/0225988 A1 * | 11/2004 | Petunin | ............... | G06F 17/5068 716/119 |
| 2014/0126572 A1 | 5/2014 | Hutton et al. | | |

OTHER PUBLICATIONS

U.S. Appl. No. 14/460,548, entitled "Programmable Circuit Having Multiple Sectors.".

* cited by examiner

*Primary Examiner* — Suresh Memula (57) ABSTRACT

In server virtualization, the resources of an integrated circuit are partitioned into smaller portions, and each of these smaller portions is then operated independently. Software is used to represent the smaller portions as virtual environments. For the purpose of server virtualization, an integrated circuit may include several different circuit designs, each implemented in a secure partition in the integrated circuit. The operation of the circuit design implementations in the integrated circuit may require that each circuit design implementation can be verified as un-altered and from the respective user or owner and as having been approved by the integrated circuit owner and/or the circuit design implementation owner. The operation of the circuit design implementations in the integrated circuit may require that each circuit design implementation can be operated securely and independently of the other circuit design implementations in the integrated circuit.

20 Claims, 7 Drawing Sheets

CIRCUIT DESIGN IMPLEMENTATIONS IN SECURE PARTITIONS OF AN INTEGRATED CIRCUIT

CROSS-REFERENCE TO RELATED APPLICATION

This application claims the benefit of United States Provisional Patent Application No. 62/045,078, filed Sep. 3, 2014, which is hereby incorporated by reference herein in its entirety.

TECHNICAL FIELD

The embodiments presented herein relate to electronic circuits and, more particularly, to techniques for implementing a circuit design in a secure partition of an integrated circuit.

BACKGROUND

Every transition from one technology node to the next technology node has led to smaller transistor geometries, which have allowed potentially more functionality implemented per unit of integrated circuit area. In recent years, server virtualization has emerged as a new technique to capitalize on the increased density provided by integrated circuits.

In server virtualization, the resources of an integrated circuit are partitioned into smaller portions, and each of these smaller portions is then used as part of a virtual server. The resources of the integrated circuit are hidden or masked from users, and software is used to represent the smaller portions as virtual environments. Each part of the virtual server can potentially implement a different circuit design from a different owner, and all parts of the virtual server can operate those circuit designs at the same time and independent of each other.

Nowadays, configurable integrated circuits such as programmable integrated circuits have evolved to include resources that enable the virtualization of resources.

SUMMARY

According to some embodiments, a computer system may implement a first circuit design with a first portion of an integrated circuit and a second circuit design with a second portion of the integrated circuit that is different than the first portion of the integrated circuit. The computer system may operate the first and second circuit designs independently of each other with the first and second portions of the integrated circuit and prevent the operating first circuit design from accessing information related to the functionality of the second circuit design. For example, an interconnect may couple the first and second portions of the integrated circuit, and the computer system may prevent communication through the interconnect. If desired, the computer system may tie off an interface signal at the interconnect, thereby preventing the operating second circuit design from accessing information related to the functionality of the first circuit design.

It should be appreciated that the present invention can be implemented in numerous ways, such as a process, an apparatus, a system, a device, or a method on a computer readable medium. Several embodiments of the present invention are disclosed herein.

In certain embodiments, the above-mentioned computer system may prevent the operating first circuit design from accessing any data stored in the second portion of the integrated circuit and the operating first circuit design from accessing any data processed by the second portion of the integrated circuit. For example, the computer system may restrict access to the first and second portions of the integrated circuit to first and second users, respectively.

If desired, the computer system may further authenticate the first circuit design with a control circuit. For example, the computer system may decrypt configuration data that configures a plurality of memory elements in the first portion of the integrated circuit.

Further features of the present invention, its nature and various advantages, will be more apparent from the accompanying drawings and the following detailed description of the preferred embodiments.

DETAILED DESCRIPTION

In server virtualization, the resources of an integrated circuit are partitioned into smaller portions, and each of these smaller portions is then used as part of a virtual server. The resources of the integrated circuit are hidden or masked from users, and software is used to represent the smaller portions as virtual environments. Each part of the virtual server can potentially implement a different circuit design from a different owner, and all parts of the virtual server can operate those circuit designs at the same time and independent of each other.

The capability to securely partition the integrated circuit into portions that may implement circuit designs associated with different users is a prerequisite for supporting server virtualization with an integrated circuit.

For the purpose of supporting server virtualization with an integrated circuit, the operation of the circuit design implementations in the integrated circuit may require that each circuit design implementation can be verified as un-altered and from the respective user or owner of the circuit design implementation and/or that each circuit design implementation can be verified as having been approved by the integrated circuit owner and/or the circuit design implementation owner.

In some embodiments, the operation of the circuit design implementations in the integrated circuit may require that each circuit design implementation can be operated securely and independently of the other circuit design implementations in the integrated circuit. For example, each circuit design implementation may prevent any other circuit design implementations from accessing any data that it processes. If desired, each circuit design implementation may be placed in the integrated circuit such that access to required resources is guaranteed. Required resources for the implementation of a circuit design may include logic circuitry (e.g., logic AND gates, logic OR gates, logic exclusive OR gates, inverters, look-up tables, multiplexers, etc.), sequential circuitry (e.g., registers, flip-flops, latches, memory circuitry, etc.), clocking circuitry (e.g., clock network interconnects, phase-locked loop circuitry, delay-locked loop circuitry, etc.), high-speed serial interface circuitry (e.g., serializer/deserializer (SerDes) circuitry, low-voltage differential signaling (LVDS) circuitry, physical media attachment (PMA) and/or physical coding sublayer (PCS) transceiver circuitry, etc.), integrated circuit inputs, integrated circuit outputs, memory interface circuitry, embedded memory circuitry, embedded arithmetic circuitry (e.g., adders, subtractors, multipliers, dividers, accumulators, etc.) including integer, fixed-point, and floating-point arithmetic circuitry, through-silicon-vias, die-to-die interconnects, etc.

It will be recognized by one skilled in the art, that the present exemplary embodiments may be practiced without some or all of these specific details. In other instances, well-known operations have not been described in detail in order not to unnecessarily obscure the present embodiments.

Figure 1:
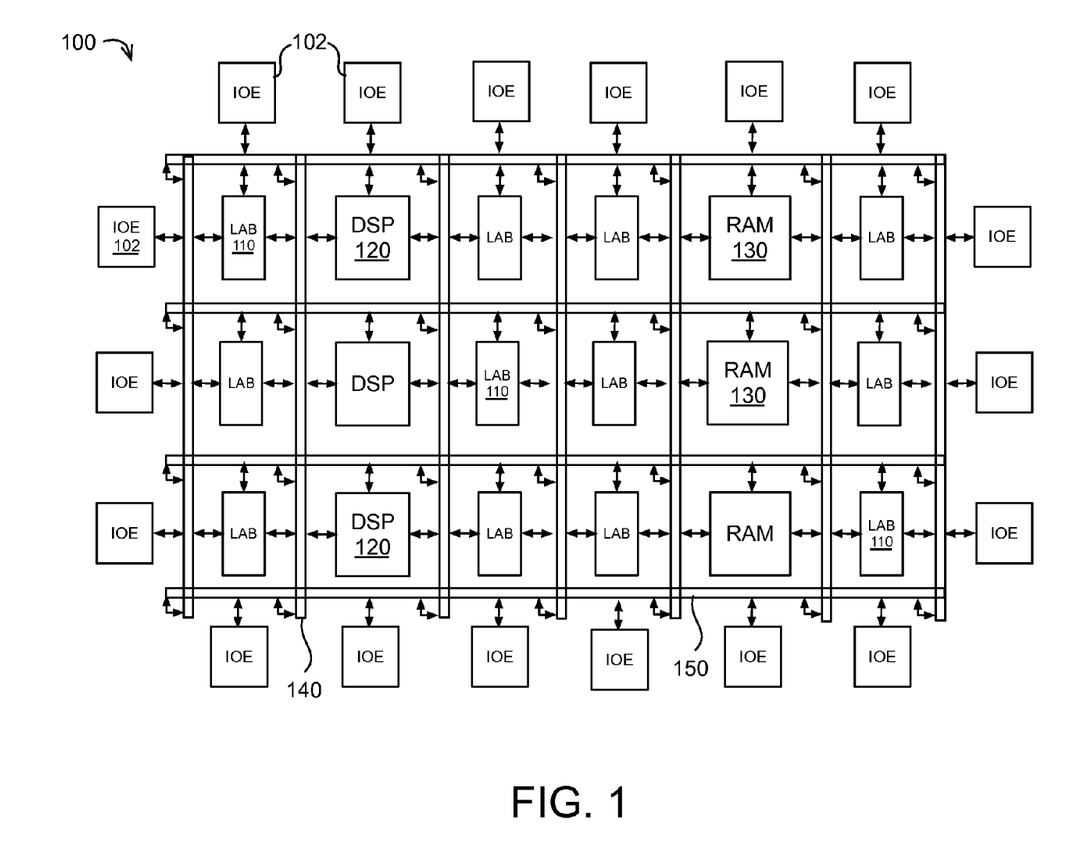
FIG. 1 is a diagram of an illustrative integrated circuit in accordance with an embodiment.

An illustrative embodiment of an integrated circuit such as programmable integrated circuit 100 that may be configured to implement circuit designs in secure partitions is shown in FIG. 1. As shown in FIG. 1, the programmable integrated circuit 100 may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

In addition, the programmable integrated circuit 100 may have input/output elements (IOEs) 102 for driving signals off of programmable integrated circuit 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable integrated circuit 100 may have input/output elements 102 arranged in different ways. For example, input/output elements 102 may form one or more columns of input/output elements that may be located anywhere on the programmable integrated circuit 100 (e.g., distributed evenly across the width of the programmable integrated circuit). If desired, input/output elements 102 may form one or more rows of input/output elements (e.g., distributed across the height of the programmable integrated circuit). Alternatively, input/output elements 102 may form islands of input/output elements that may be distributed over the surface of the programmable integrated circuit 100 or clustered in selected areas.

The programmable integrated circuit 100 may also include programmable interconnect circuitry in the form of vertical routing channels 140 (i.e., interconnects formed along a vertical axis of programmable integrated circuit 100) and horizontal routing channels 150 (i.e., interconnects formed along a horizontal axis of programmable integrated circuit 100), each routing channel including at least one track to route at least one wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of programmable integrated circuit 100, fractional global wires such as wires that span part of programmable integrated circuit 100, staggered wires of a particular length, smaller local wires, or any other suitable interconnection resource arrangement.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Programmable integrated circuit 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor field-effect transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), or programmable memory elements.

The programmable memory elements may be organized in a configuration memory array consisting of rows and columns. A data register that spans across all columns and an address register that spans across all rows may receive configuration data. The configuration data may be shifted onto the data register. When the appropriate address register is asserted, the data register writes the configuration data to the configuration memory bits of the row that was designated by the address register.

In certain embodiments, programmable integrated circuit 100 may include configuration memory that is organized in sectors, whereby a sector may include the configuration RAM bits that specify the function and/or interconnections of the subcomponents and wires in or crossing that sector. Each sector may include separate data and address registers. Further information on sectors can be found in commonly-owned U.S. patent application Ser. No. 14/460,548, entitled "Programmable Circuit Having Multiple Sectors," which is hereby incorporated by reference herein in its entirety.

Figure 2:
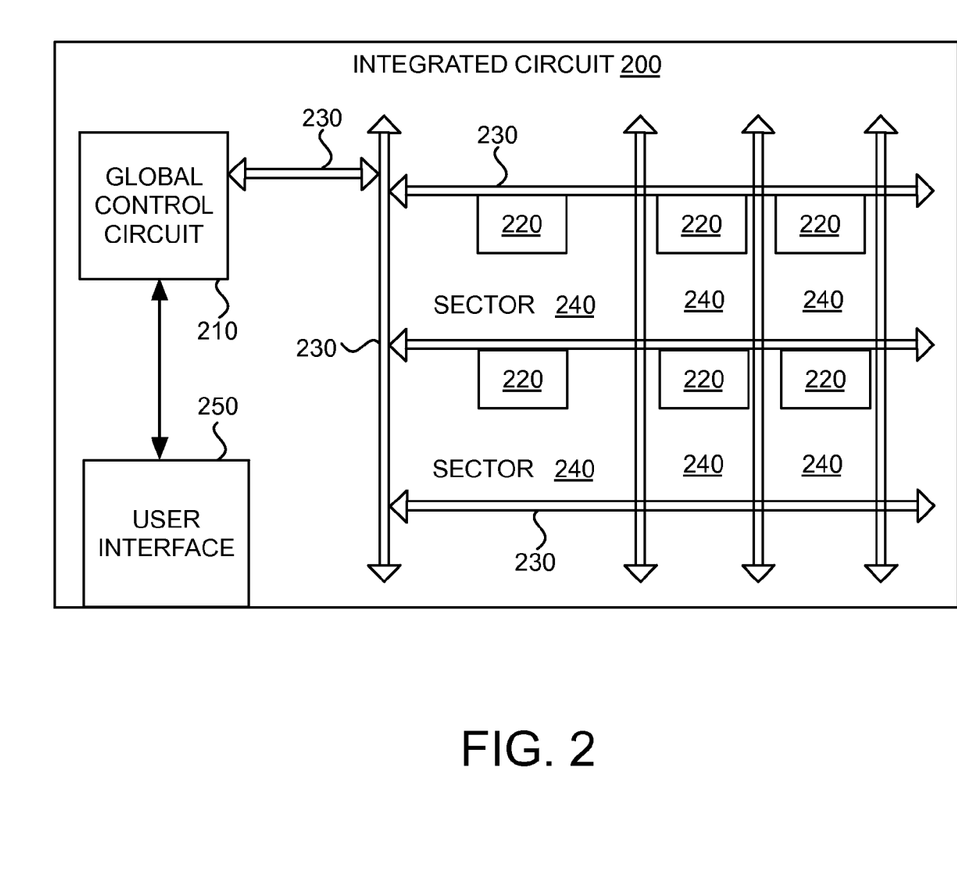
FIG. 2 is a diagram of an illustrative integrated circuit with a user interface and a global control circuit that controls multiple sectors over a network in accordance with an embodiment.

FIG. 2 shows an illustrative integrated circuit 200 such as programmable integrated circuit 100 with configuration memory that is organized in sectors 240. Each sector 240 may include a local control circuit 220. These local control circuits may control the clock distribution networks and the configuration of the respective sectors 240.

In certain embodiments, the local control circuits 220 may be implemented as state machines. In certain embodiments, the local control circuits 220 may be implemented as minimal processors. Each operation supported by local control circuits 220 may be implemented as a separate routine in a memory containing a control program.

In certain embodiments, this control program memory may receive and store new routines in order to implement new operations and functionality into the sectors.

Communication network 230 may connect local control circuits 220 to a global control circuit 210. If desired, communication network 230 may be implemented as a mesh-based network-on-chip (NoC). Further information on Networks-on-Chip and FPGAs can be found in commonly-owned U.S. Patent Application Publication No. 2014/0126572, "Programmable Logic Device with Integrated Network-on-Chip," which is hereby incorporated by reference herein in its entirety.

Global control circuit 210 may connect to device pins through which it can communicate with user interface 250. User interface 250 may include, for example, a JTAG scan chain, input/output ports, programmable logic circuits, or any combination of these circuits. Global control circuit 210 may receive commands from user interface 250, process the received commands, and send the processed commands to local control circuits 220 as required through communication network 230. In response to receiving commands from global control circuit 210, the local control circuits 220 may orchestrate the reading of the storage circuits in the respective sectors 240 and then send the data retrieved from the storage circuits back over communication network 230 to global control circuit 210.

Because global control circuit 210 is responsible for, among other things, coordinating the operations of the local control circuits 220, for communication between user interface 250 and the local control circuits 220, and for security features, global control circuit 210 (or at least a portion thereof) may be implemented in a processor as well. The processor may be a dedicated processor, special boot-up code for a user-visible processor already included in the device's design, or another suitable arrangement.

Global control circuit 210 may communicate with user interface 250 at a high data rate (e.g., through a high-speed serial interface (HSSI) transceiver circuit for example using the 10 Gigabit Ethernet protocol or the Peripheral Component Interconnect Express (PCIe) protocol, to name a few). Global control circuit 210 may communicate with the local control circuits 220 through a time-multiplexed communication network 230, for example, with each of the local control circuits 220 operating at a comparably lower rate but in parallel.

An advantage of the division into sectors may be that the local control circuits 220 may operate independently and in parallel, thereby enabling secure partitions in the integrated circuit, which may operate multiple circuit design implementations independently and in parallel.

Figure 3:
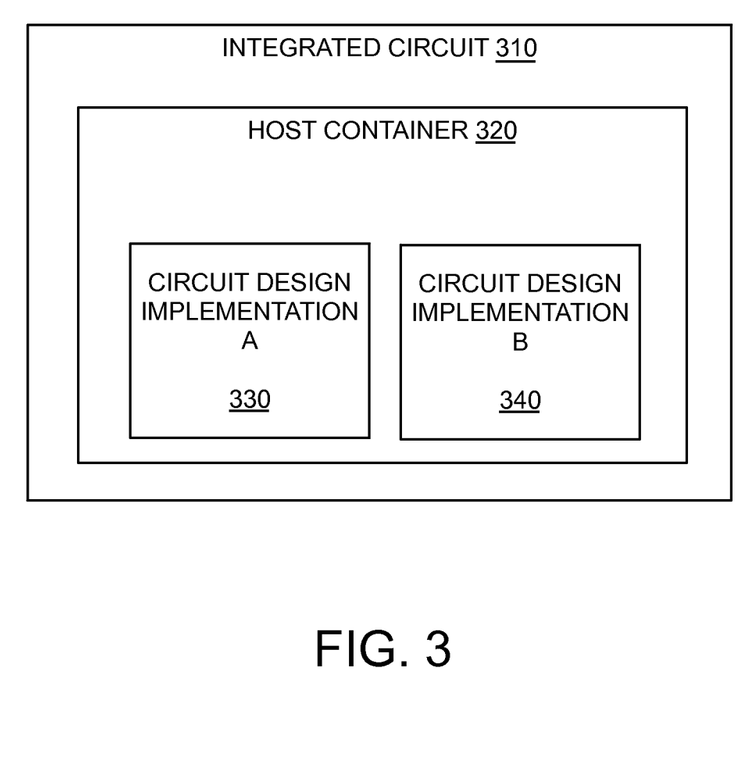
FIG. 3 is a diagram of an illustrative integrated circuit that implements two circuit designs in two distinct partitions in accordance with an embodiment.

FIG. 3 is a diagram of an illustrative integrated circuit that implements two circuit designs in two distinct partitions. As shown in FIG. 3, integrated circuit 310 may include host container 320, which may include circuit design implementation A (330) and circuit design implementation B (340).

Consider the example in which circuit design implementations A and B are implemented as secure partitions with access to shared resources of integrated circuit 310. In this scenario, host container 320 may manage shared resources (e.g., clock network interconnects, phase-locked loop circuitry, delay-locked loop circuitry, high-speed serial interface circuitry, integrated circuit inputs, integrated circuit outputs, memory interface circuitry, embedded memory circuitry, embedded arithmetic circuitry, through-silicon-vias, and die-to-die interconnects). If desired, host container 320 may secure access to unsecure interfaces to prevent the circuit design implementations (i.e., 330 and 340) from accessing information from host container 320 and/or integrated circuit 310 and to prevent the circuit design implementations from taking control over host container 320 and/or integrated circuit 310. In some embodiments, host container 320 may prevent the circuit design implementations 330 and 340 from accessing information related to the functionality of the respective other circuit design implementation or related to data stored in the respective other circuit design implementation.

As an example, host container 320 may be authenticated correctly before loading data and may be signed by the host owner. Similarly, the circuit designs A and/or B may be authenticated before being implemented in integrated circuit 310 as circuit design implementations 330 and/or 340, respectively. If desired, the authentication may be signed by the respective owner of the circuit designs, and only authorized authenticated circuit designs may be allowed to load and execute in integrated circuit 310. In some embodiments, the circuit design authentication may use a common root key. In other embodiments, the circuit design authentication may use a separate root key. If desired, circuit design implementations A and/or B (330 and 340) and host container 320 may perform tasks related to configuration, monitoring, reporting, and debug.

Figure 4:
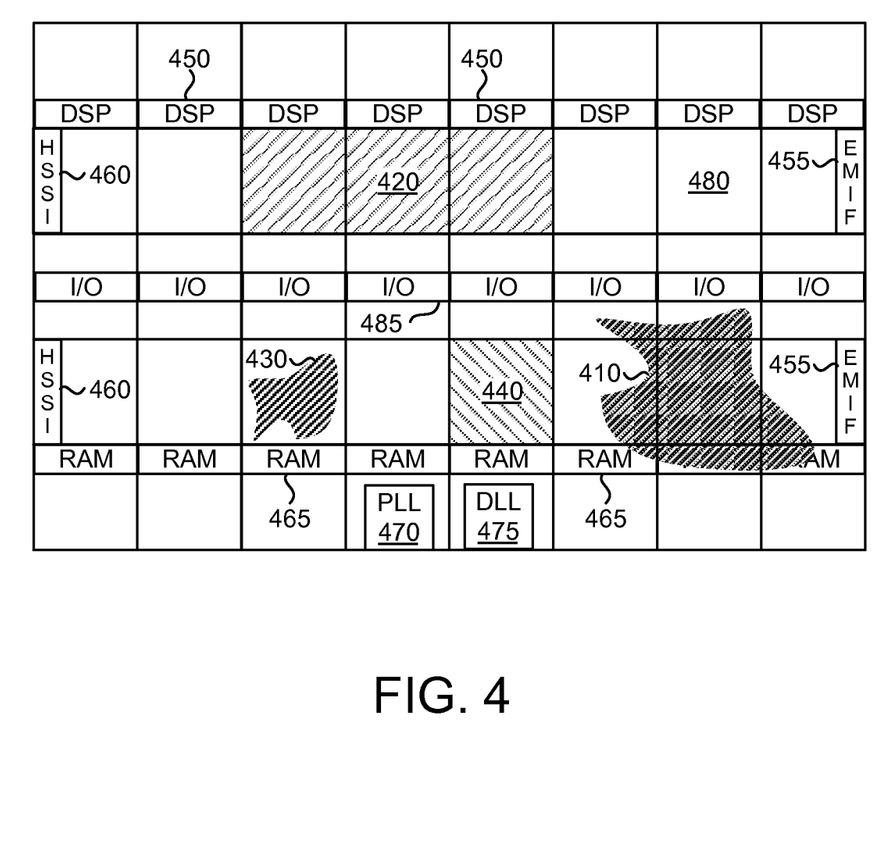
FIG. 4 is a diagram of an illustrative integrated circuit that is organized in sectors and includes heterogeneous resources used to implement multiple circuit designs in accordance with an embodiment.

Organizing the integrated circuit in sectors as shown in FIG. 2 may facilitate the implementation of secure partitions. FIG. 4 is a diagram of an illustrative integrated circuit that is organized in sectors 480. The integrated circuit may implement multiple circuit designs (e.g., in portions 410, 420, 430, and 440 of the integrated circuit) in accordance with an embodiment.

As shown in FIG. 4, the integrated circuit may include heterogeneous resources such as interconnects that couple different resources in the integrated circuit, logic circuitry (e.g., in sectors 480), digital signal processing (DSP) blocks 450, external memory interface (EMIF) blocks 455, high-speed serial interface (HSSI) blocks 460, random-access memory (RAM) blocks 465, phase-locked loop (PLL) circuit 470, delay-locked loop (DLL) circuit 475, and input/output (I/O) blocks 485. If desired, the integrated circuit may include additional resources that are not shown in FIG.

4 in order not to unnecessarily obscure the present embodiment. For example, the integrated circuit may include clock network interconnects, additional embedded memory circuitry (e.g., content-addressable memory (CAM) blocks, read-only memory (ROM) blocks, first-in first-out (FIFO) circuits or queues, last-in first-out (LIFO) circuits or stacks, etc.), additional embedded arithmetic circuitry (e.g., an arithmetic logic unit (ALU), specialized adder circuitry, etc.), through-silicon-vias, die-to-die interconnects, etc.

Consider the scenario in which the circuit designs A, B, C, and D are implemented in portions 410, 420, 430, and 440 of the integrated circuit, respectively. In this scenario, a virtual machine manager (VMM), which is sometimes also referred to as a hypervisor, may manage the various different resources of the integrated circuit. For example, the VMM may distinguish between resources that are used by a circuit design implementation (e.g., A, B, C, or D) and contained within the corresponding portion of the integrated circuit (e.g., 410, 420, 430, or 440), resources that are used by a circuit design implementation and transect the respective portion of the integrated circuit, resources that are not used by a circuit design implementation and contained within the corresponding portion of the integrated circuit, and resources that are not used by a circuit design implementation and transect the respective portion of the integrated circuit.

In the example of the integrated circuit of FIG. 1, those resources may include configuration memory elements, functional blocks such as logic array blocks (LABs) 110, random access memory (RAM) blocks 130, digital signal processing (DSP) blocks 120, input/output elements (IOEs) 102, portions of a clock network or an entire clock network, and interconnect circuitry such as vertical and/or horizontal routing channels.

In the scenario described above, the virtual machine manager (VMM) may ensure that the portions 410, 420, 430, and 440 of the integrated circuit are isolated from each other by preventing interaction between the portions 410, 420, 430, and 440 of the integrated circuit. In other words, the portions 410, 420, 430, and 440 of the integrated circuit may operate as secure partitions. Neither of the portions 410, 420, 430, nor 440 of the integrated circuit may access information related to the functionality of or to the data stored in another one of the portions 410, 420, 430, and 440 of the integrated circuit.

As an example, the virtual machine manager (VMM) may allocate resources that are at least partially within the respective portion 410, 420, 430, or 440 of the integrated circuit to the respective portion of the integrated circuit, independently of whether those resources transect or not the boundary of the respective portion of the integrated circuit and independently of whether those resources are used or not by the respective circuit design implementation.

If desired, the virtual machine manager may reserve some resources. In some embodiments, the virtual machine manager may allocate some or all of those reserved resources at a later time. For example, the virtual machine manager may reserve interconnects in the horizontal or vertical routing channels that may support a route across the respective portion of the integrated circuit without interfering with it and allocate the reserved interconnects to a different portion of the integrated circuit (e.g., to access one of the shared resources such as an EMIF block 455 or a HSSI block 460). If desired, the virtual machine manager (VMM) may maintain the reserved state of some or all of the reserved resources to increase the security of the partitions. In some embodiments, the virtual machine manager (VMM) may allocate some of the resources to so-called moat partitions, which may prevent resources in the vicinity of a portion 410, 420, 430, or 440 of the integrated circuit from being used.

In some embodiments, the virtual machine manager (VMM) may implement partial reconfiguration masks for the portions 410, 420, 430, and 440 of the integrated circuit, whereby each partial reconfiguration mask programs the configuration memory bits in the respective portion of the integrated circuit. If desired, the virtual machine manager (VMM) may first create the partial reconfiguration masks independent of each other and then combine the partial reconfiguration masks to prevent any of the circuit design implementations from utilizing a resource that belongs to another one of the circuit design implementations, thereby preventing access to the functionality of and/or the data stored in the other circuit design implementations.

In the example of integrated circuit 200 of FIG. 2, global control circuit 210 together with local control circuits 220 may play the role of the virtual machine manager (VMM) by controlling partial reconfiguration of sectors 240. For example, global control circuit 210 may manage keys, distribute configuration, command and control data to local control circuits 220, authenticate and decrypt its own executable as well as sector configuration data, control the communication of debug, command, and control data between a set of sectors 240, authenticate server generated debug, command, and control data and control the communication of the authenticated server generated data to and from sectors 240, provide an interface for configuration, command and debug channels to and from the server infrastructure logic (e.g., user interface 250 and/or other sectors 240), and for communication with resources external to the integrated circuit.

Communication network 230 may transport the configuration, debug, command, and control data securely between the global control circuit 210 and the local control circuits 220, the global control circuit 210 and the sectors 240, and between sectors 240. The local control circuits 220 may manage the respective sector and ensure separable configuration of the respective sector 240, the transport of debug, command, and control data from the sector 240 over the communication network 230 to the global control circuit 210, and transport of server debug, command, and control data between the circuit design implementations and the server infrastructure in other sectors 240.

Figure 5:
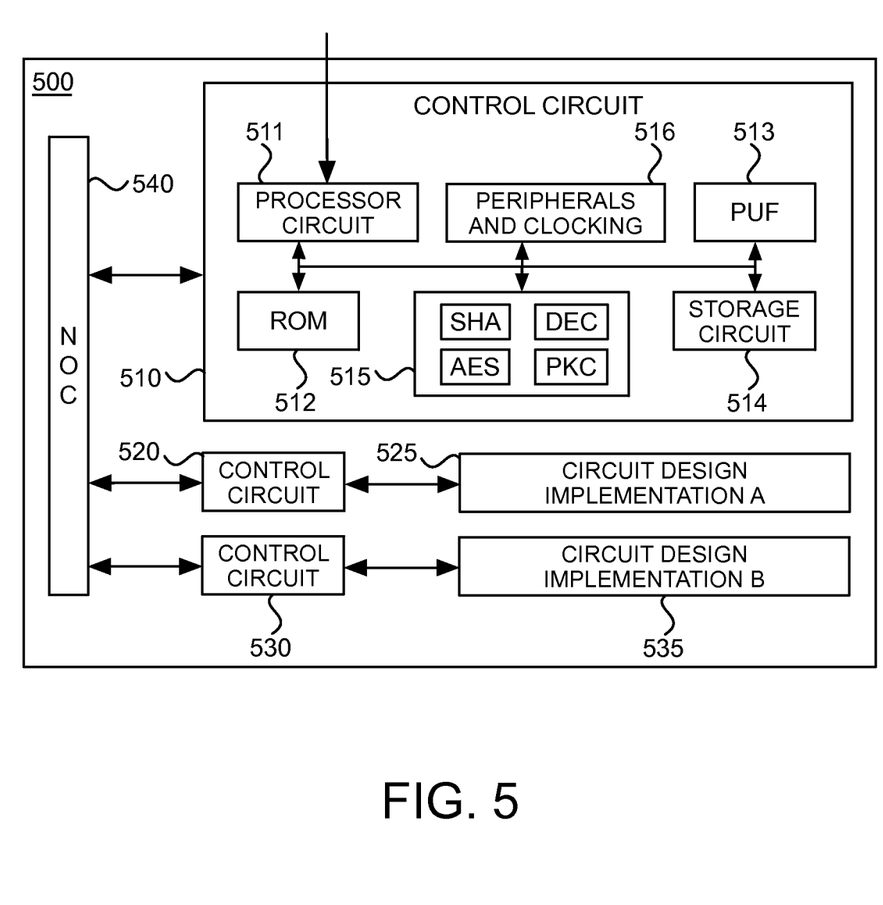
FIG. 5 is a diagram of an illustrative integrated circuit with control circuits that communicate with each other through a network-on-chip (NOC) and insure the independent operation of circuit design implementations in accordance with an embodiment.

FIG. 5 is a diagram of an illustrative integrated circuit 500 with control circuits 510, 520, and 530 that communicate with each other through a network-on-chip (NOC, 540) and insure the independent operation of circuit design implementations 525 and 535 in accordance with an embodiment. Control circuit 510 may include interconnect resources (e.g., a bus, a network-on-chip, point-to-point interconnects, etc.) that couple processor circuit 511, read-only memory (ROM) 512, physically unclonable function (PUF) circuitry 513, storage circuit 514, cryptographic circuit 515, and peripherals and clocking 516.

Cryptographic circuit 515 may include advanced encryption standard (AES) circuitry, secure hash algorithm (SHA) circuitry, public-key cryptography (PKC) acceleration circuitry, and decompression (DEC) circuitry. Peripherals and clocking 516 may include an oscillator, a delay-locked loop (DLL) circuit, a phase-locked loop circuit, a queued serial peripheral interface (QSPI), a universal asynchronous receiver/transmitter (UART), a joint test action group (JTAG) interface, an inter-integrated circuit (I2C) interface, etc.

As shown in FIG. 5, storage circuit 514 may store keys. As an example, storage circuit 514 may store public and private keys. The keys may be permanent (e.g., fuse-programmed or battery backed) or volatile. The keys may belong to an owner of a circuit design implementation, the owner of the integrated circuit, or the owner of the server implementation (e.g., the owner of host container 320 of FIG. 3). If desired, storage circuit 514 may be write-only. In some embodiments, storage circuit 514 may allow read access for the purpose of passing keys selectively to the AES circuitry.

Processor circuit 511 may provide system management for integrated circuit 500 through the interconnect resources and through network-on-chip 540. If desired, ROM 512 may provide a root of trust boot to the processor circuit 511, thereby passing transitive trust to code loaded into the processor circuit after the authentication of the code against the appropriate public keys retrieved from storage circuit 514. The root of trust authenticated code may require that the code related to a circuit design implementation is co-signed by the owner of integrated circuit 500. In some embodiments, processor circuit 511 may execute code that performs key unwrapping (i.e., key decryption and authentication) for additional keys that are loaded from outside integrated circuit 500 and stored in storage circuit 514.

PUF circuitry 513 may extract a unique secret key for integrated circuit 500, and cryptographic circuit 515 may authenticate and decrypt command, debug, control and configuration data using the secret key before the authenticated and decrypted data is sent over NOC 540 to control circuits 530 and/or 520. If desired, cryptographic circuit 515 may perform separate decryption and authentication using a first encryption key for the data related to circuit design implementation A 525 that is sent to control circuit 520 and using a second different encryption key for the data related to circuit design implementation B 535 that is sent to control circuit 530, respectively, thereby verifying that each circuit design implementation is un-altered and belongs to the expected circuit design owner. Control circuit 510 may ensure that the first encryption key is only used to decrypt data for circuit design implementation A 525 and that the second encryption key is only used to decrypt data for circuit design implementation B 535. In some embodiments, control circuit 510 may provide key separation between the keys that are used to authenticate and decrypt the data related to circuit design implementations 525 and 535 and the keys that are used to authenticate and decrypt the code executing on processor circuit 511. Each of the control circuits 520 and 530 may, for example, be a local control circuit 220 in a respective sector 240, as shown in FIG. 2. Control circuit 510 may be an example of global control circuit 210 in FIG. 2.

Processor circuit 511 may control access to peripherals and clocking 516. For example, processor circuit 511 may grant the owner of circuit design implementation 525 access to peripherals such as a UART interface or a JTAG interface after the owner has been authenticated.

NOC 540 may support multiple channels of data concurrently between control circuit 510 and control circuits 520 and 530. If desired, NOC 540 may bypass control circuits 520 and 530, thereby providing access from control circuit 510 to circuit design implementations 525 and 535 directly.

In some embodiments, decrypted data is routed from control circuit 510 through a header generator circuit, which may control the distribution of the data to control circuits 520 and 530 by prepending a header on a set of data. For this purpose, processor circuit 511 may control the header generation to prevent the data from controlling its destination.

Control circuits 520 and 530 may control access to circuit design implementations 525 and 535, respectively. For example, control circuits 520 and 530 may control the programming of configuration memory bits, thereby ensuring the secure and independent implementation of circuit designs A and B, respectively. If desired, control circuits 520 and 530 may control the communication between circuit design implementations 525 and 535, respectively, and control circuit 510 over NOC 540 (e.g., by controlling the transport of debug, command, and control data between the circuit design implementations 525 and 535, control circuit 510, and server infrastructure logic). In some embodiments, control circuits 520 and 530 may manage asynchronous and/or synchronous reset operations of the circuit design implementations 525 and 535, and/or partial reconfiguration freeze and unfreeze operations of the circuit design implementations 525 and 535, respectively.

Control circuits 510, 520, and 530 may operate circuit design implementations 525 and 535 independently and undetectably with respect to each other. In other words, control circuits 510, 520, and 530 may prevent the operating circuit design implementation 525 from accessing information related to the functionality of circuit design implementation 535 and/or the data processed by circuit design implementation 535. Similarly, control circuits 510, 520, and 530 may prevent the operating circuit design implementation 535 from accessing information related to the functionality of circuit design implementation 525 and/or the data processed by circuit design implementation 525. For example, control circuit 510 may use separate and protected communication channels in NOC 540 to interact with control circuits 520 and 530, respectively. As an example, control circuit 510 may encrypt and decrypt data using different keys depending on whether the data is sent to or received from control circuit 520 versus sent to or received from control circuit 530. Similarly, control circuits 520 and 530 may perform encryption of data before transmission and decryption of data upon reception.

In some embodiments, a computer system may prevent communication between circuit design implementations 525 and 535 during the compilation of the respective circuit designs. For example, the computer system may generate configuration data for each of the circuit designs and prevent interconnects that intersect with one of the circuit design implementations or run across one of the circuit design implementations from being used. As another example, if an interconnect couples a first portion of integrated circuit 500 that implements circuit design 525 to a second portion of integrated circuit 500 that implements circuit design 535, the computer system may prevent communication through the interconnect between the first and second portions of integrated circuit 500. The computer system may, for example, tie off an interface signal at the interconnect to prevent communication between circuit design implementations 525 and 535. Alternatively, the computer system may define a set of rules and validate each circuit design implementation against the rules (e.g., using a rule checker) to, for example, prevent communication between circuit design implementations 525 and 535.

During compilation, the computer system may perform placement and routing operations that ensure that each circuit design implementation has access to required resources. In other words, the computer system may manage shared resources to prevent the circuit design implementations 525 and 535 from interfering with the usage of those resources. As an example, the computer system may prevent circuit design implementations 525 and 535 from using a shared resource at the same time.

Figure 6:
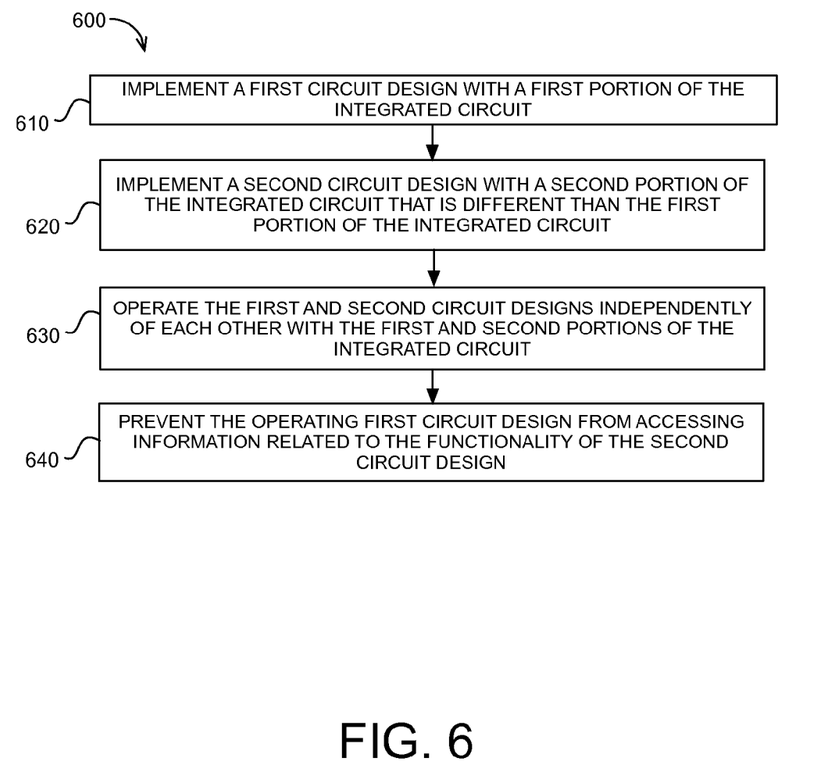
FIG. 6 is a flow chart showing illustrative steps for operating an integrated circuit with first and second circuit designs implemented in first and second portions of the integrated circuit, respectively, in accordance with an embodiment.

FIG. 6 is a flow chart 600 showing illustrative steps for operating an integrated circuit with first and second circuit designs (e.g., circuit designs A and B of FIG. 5) implemented in first and second portions of the integrated circuit (e.g., circuit design implementations 525 and 535 of FIG. 5), respectively. For example, during step 610, a computer system may implement a first circuit design with a first portion of the integrated circuit. During step 620, the computer system may implement a second circuit design with a second portion of the integrated circuit that is different than the first portion of the integrated circuit. During step 630, the computer system may operate the first and second circuit designs independently of each other with the first and second portions of the integrated circuit. The computer system may prevent the operating first circuit design from accessing information related to the functionality of the second circuit design during step 640.

Figure 7:
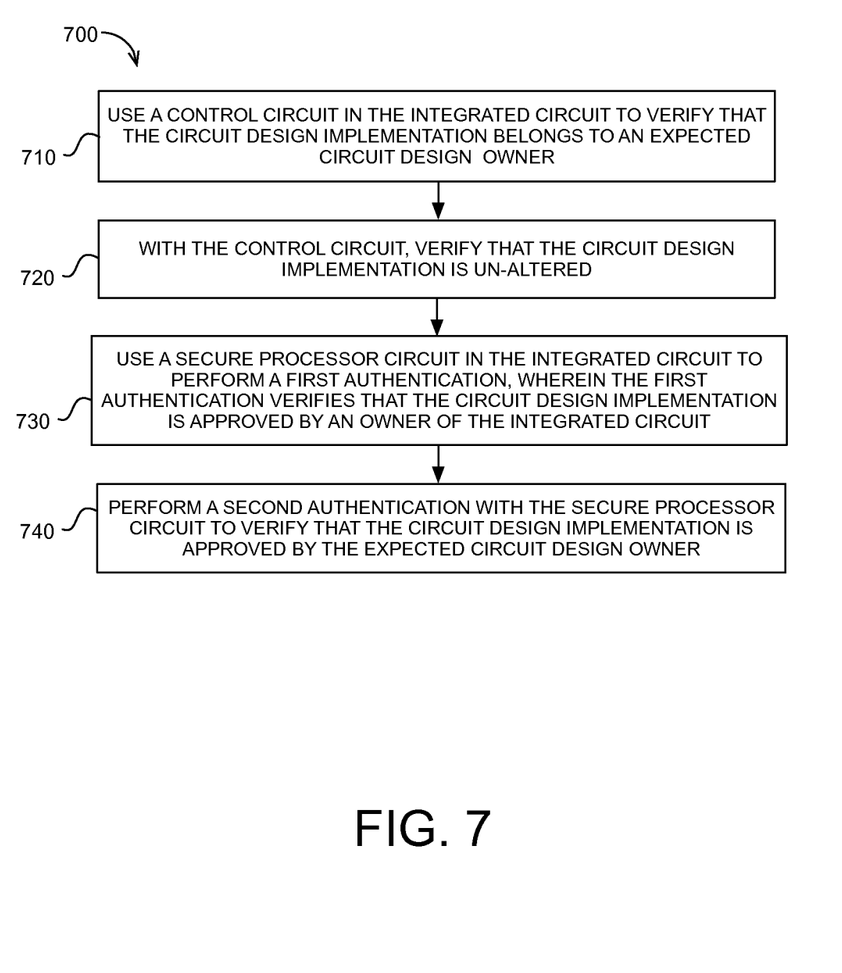
FIG. 7 is a flow chart showing illustrative steps for operating a circuit design implemented in a secure partition of an integrated circuit in accordance with an embodiment.

FIG. 7 is a flow chart 700 showing illustrative steps for operating a circuit design implemented in a secure partition of an integrated circuit in accordance with an embodiment. For example, during step 710, a virtual machine manager may use a control circuit in the integrated circuit (e.g., control circuit 510 in integrated circuit 500 of FIG. 5) to verify that the circuit design implementation belongs to an expected circuit design owner. During step 720, the virtual machine manager may verify with the control circuit that the circuit design implementation is un-altered. The virtual machine manager may use a secure processor circuit in the integrated circuit (e.g., processor circuit 511 in integrated circuit 500 of FIG. 5) to perform a first authentication, wherein the first authentication verifies that the circuit design implementation is approved by an owner of the integrated circuit, during step 730. During step 740, the virtual machine manager may perform a second authentication with the secure processor circuit to verify that the circuit design implementation is approved by the expected circuit design owner. The owner of the integrated circuit and the expected circuit design owner may be different individuals or entities. In some cases, the owner of the integrated circuit and the expected circuit design owner may be the same person or entity.

The methods and apparatuses described herein may be incorporated into any suitable electronic device or system of electronic devices. For example, the methods and apparatuses may be incorporated into numerous types of devices such as microprocessors or other integrated circuits (ICs). Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs), just to name a few.

The integrated circuits described herein may be part of a data processing system that includes one or more of the following components; a processor; memory; I/O circuitry; and peripheral devices. The integrated circuits can be used in a wide variety of applications, such as computer networking, data networking, instrumentation, video processing, digital signal processing, or any suitable other application such as hardware emulation or prototyping where the advantage of server virtualization and secure partitions in an integrated circuit is desirable.

Although the method operations were described in a specific order, it should be understood that other operations may be performed in between described operations, described operations may be adjusted so that they occur at slightly different times or described operations may be distributed in a system that allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit, comprising:
    first and second circuit designs implemented in first and second portions of the integrated circuit, respectively, wherein the first and second portions of the integrated circuit are disjoint;
    a first control circuit that controls at least a portion of the first circuit design implementation;
    a second control circuit that controls at least a portion of the second circuit design implementation; and
    a third control circuit coupled to the first and second control circuits that prevents interaction between the first and second circuit design implementations by restricting access to the first and second portions of the integrated circuit to first and second users, respectively,
    wherein the third control circuit encrypts and decrypts data exchanged with the first control circuit using a first key to prevent the second circuit design implementation from accessing information related to functionality of the first circuit design implementation, and
    wherein the third control circuit encrypts and decrypts data exchanged with the second control circuit using a second key that is different than the first key to prevent the first circuit design implementation from accessing information related to functionality of the second circuit design implementation.

2. The integrated circuit of claim 1, wherein the third control circuit comprises:
    circuitry that extracts the second key from the integrated circuit that is used to authenticate data provided between the second and third control circuits to prevent the first circuit design implementation from accessing information related to the second circuit design implementation.

3. The integrated circuit of claim 2, wherein the circuitry implements a physically unclonable function (PUF).

4. The integrated circuit of claim 2, wherein the third control circuit further comprises:
    a cryptographic circuit that decrypts configuration data separately for the first and second circuit design implementations using the first and second keys, wherein the configuration data configures a plurality of memory elements in the integrated circuit.

5. The integrated circuit of claim 4, wherein the third control circuit further comprises:
    a storage circuit that stores the first key, wherein the cryptographic circuit accesses the first key to decrypt a subset of configuration data that configures a subset of the plurality of memory elements inside the first portion of the integrated circuit.

6. The integrated circuit of claim 2, wherein the third control circuit further comprises:
   a read-only memory circuit that stores instructions; and
   a processor circuit that receives code, retrieves the instructions from the read-only memory circuit, and executes the instructions to authenticate the received code against the second key.

7. The integrated circuit of claim 1, further comprising:
   a network-on-chip (NOC) coupled between the third control circuit and the first and second control circuits.

8. The integrated circuit of claim 7, wherein the network-on-chip transports command and control data from the third control circuit to the first control circuit, and wherein the third control circuit authenticates the command and control data transported to the first control circuit to prevent the second circuit design implementation from accessing information related to the first circuit design implementation.

9. The integrated circuit of claim 7, wherein the third control circuit uses separate and protected communication channels in the NOC to interact with the first and second control circuits.

10. The integrated circuit of claim 1, wherein the first control circuit is a first processor circuit, and wherein the second control circuit is a second processor circuit.

11. The integrated circuit of claim 1, wherein the first and second control circuits are state machines.

12. The integrated circuit of claim 1, wherein the integrated circuit is a programmable integrated circuit comprising logic array blocks, memory blocks, and digital signal processing blocks.

13. The integrated circuit of claim 1, wherein the first and second control circuits perform encryption of data before transmission and decryption of data upon reception using the first and second keys, respectively.

14. The integrated circuit of claim 1, wherein an interconnect couples the first portion of the integrated circuit that implements the first circuit design to the second portion of the integrated circuit that implements the second circuit design, and wherein communication through the interconnect between the first and second portions of the integrated circuit is prevented.

15. The integrated circuit of claim 14, wherein an interface signal at the interconnect is tied off to prevent communication between the first and second circuit design implementations.

16. The integrated circuit of claim 1, wherein the integrated circuit is a programmable integrated circuit comprising programmable interconnect circuitry, and wherein a computer system generates configuration data for each of the first and second circuit design implementations and prevents interconnects in the programmable interconnect circuitry that intersect with one of the first or second circuit design implementations or that run across one of the first or second circuit design implementations from being used.

17. The integrated circuit of claim 1, wherein the third control circuit provides key separation between the first and second keys and third keys that are used to authenticate and decrypt code executing on a processor circuit in the third control circuit.

18. A method comprising:
   implementing first and second circuit designs in first and second portions of an integrated circuit, respectively, wherein the first and second portions of the integrated circuit are disjoint;
   using a first control circuit, controlling at least a portion of the first circuit design implementation;
   using a second control circuit, controlling at least a portion of the second circuit design implementation;
   using a third control circuit, preventing interaction between the first and second circuit design implementations by restricting access to the first and second portions of the integrated circuit to first and second users, respectively;
   using the third control circuit, encrypting and decrypting data exchanged with the first control circuit using a first key to prevent the second circuit design implementation from accessing information related to functionality of the first circuit design implementation; and
   using the third control circuit, encrypting and decrypting data exchanged with the second control circuit using a second key that is different than the first key to prevent the first circuit design implementation from accessing information related to functionality of the second circuit design implementation.

19. The method of claim 18 further comprising:
   preventing communication through an interconnect between the first and second portions of the integrated circuit, wherein the interconnect couples the first portion of the integrated circuit that implements the first circuit design to the second portion of the integrated circuit that implements the second circuit design.

20. The method of claim 18, wherein the integrated circuit is a programmable integrated circuit comprising programmable interconnect circuitry, and wherein the method further comprises:
   preventing interconnects in the programmable interconnect circuitry that intersect with one of the first or second circuit design implementations or that run across one of the first or second circuit design implementations from being used.

* * * * *